(12) United States Patent
Wang et al.

(10) Patent No.: US 8,957,429 B2
(45) Date of Patent: Feb. 17, 2015

(54) LIGHT EMITTING DIODE WITH WAVELENGTH CONVERSION LAYER

(75) Inventors: Chih-Ming Wang, Hsinchu (TW); Chao-Hsing Chen, Hsinchu (TW); Chien-Fu Shen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/367,781

(22) Filed: Feb. 7, 2012

(65) Prior Publication Data

US 2013/0200398 A1    Aug. 8, 2013

(51) Int. Cl.
*H01L 29/18*    (2006.01)
*H01L 33/00*    (2010.01)

(52) U.S. Cl.
USPC .......................................................... 257/88

(58) Field of Classification Search
CPC ....................................................... H01L 33/50
USPC ...................... 257/79, 88, 94, 99; 438/26, 29; 313/498, 503
See application file for complete search history.

(56) References Cited

U.S. PATENT DOCUMENTS

| | | | |
|---|---|---|---|
| 6,756,186 B2 | 6/2004 | Collins, III et al. | |
| 7,157,745 B2* | 1/2007 | Blonder et al. | 257/98 |
| 7,420,218 B2* | 9/2008 | Nagai | 257/98 |
| 7,528,077 B2 | 5/2009 | Izuno et al. | |
| 8,241,932 B1* | 8/2012 | Yu et al. | 438/28 |
| 2003/0181122 A1 | 9/2003 | Collins, III et al. | |
| 2004/0245543 A1* | 12/2004 | Yoo | 257/103 |
| 2005/0151147 A1 | 7/2005 | Izuno et al. | |
| 2007/0241342 A1* | 10/2007 | Inoue et al. | 257/79 |
| 2008/0006815 A1* | 1/2008 | Wang et al. | 257/13 |
| 2008/0018230 A1* | 1/2008 | Yamada et al. | 313/498 |
| 2008/0290351 A1* | 11/2008 | Ajiki et al. | 257/88 |
| 2008/0315228 A1* | 12/2008 | Krames et al. | 257/98 |
| 2009/0057701 A1* | 3/2009 | Chao | 257/98 |
| 2009/0262517 A1* | 10/2009 | Suehiro et al. | 362/84 |
| 2009/0321769 A1* | 12/2009 | Keller et al. | 257/98 |
| 2009/0321778 A1* | 12/2009 | Chen et al. | 257/99 |
| 2010/0176475 A1* | 7/2010 | Sano et al. | 257/432 |
| 2010/0320479 A1* | 12/2010 | Minato et al. | 257/88 |

* cited by examiner

*Primary Examiner* — Vongsavanh Sengdara
*Assistant Examiner* — Ismail Muse
(74) *Attorney, Agent, or Firm* — Patterson & Sheridan, LLP

(57) ABSTRACT

A light-emitting device comprises a base, a light-emitting unit comprising a semiconductor stack disposed on the base, and a wavelength conversion layer covering the light-emitting unit, wherein the wavelength conversion layer does not physically contact the base.

16 Claims, 14 Drawing Sheets

LIGHT EMITTING DIODE WITH WAVELENGTH CONVERSION LAYER

TECHNICAL FIELD

The present application relates to a light-emitting device comprising a semiconductor stacking layer with a wavelength conversion layer, and a method to manufacture the same.

DESCRIPTION OF BACKGROUND ART

Light-emitting devices manufactured with compound semiconductor light-emitting diodes can realize various colors and are used for various applications including lamps, electric display boards, and displays. In particular, since the light-emitting device can realize white light, it is used for general lighting.

Generally, white light can be obtained by a combination of the blue light-emitting diode and phosphors. FIG. 1A shows the light-emitting diode 2 covered by the phosphor layer 1. The light-emitting diode 2 is connected to the substrate 58 by one or more conductive units 5. The material of the conductive unit can be metal such as Au, Cu, Sn, Ag, Al, or an alloy such as AuSn or AgSn, and the conductive unit 5 is generally formed by evaporation. Eutectic bonding process is a common method for connecting the light-emitting diode 2 and the substrate 58. Since the structure of the conductive unit formed by evaporation is loose, the conductive unit would shrink during the eutectic bonding process. FIG. 1B shows the light-emitting diode 2 is connected to the substrate 58 with the conductive units 5 which is shrunken. Since the shrinking effect of the conductive units 5 occurs, a portion of the phosphor layer 1A flows into the space between the substrate 58 and each of the conductive units 5 so a gap 100 is formed and causes the eutectic bonding to fail.

SUMMARY OF THE DISCLOSURE

A light-emitting device comprises a base, a light-emitting unit comprising a semiconductor stack disposed on the base, and a wavelength conversion layer covering the light-emitting unit, wherein the wavelength conversion layer does not physically contact the base.

A light-emitting device comprises a base, a resist layer on the base, a plurality of light-emitting units having a side wall on the base, wherein the side wall of each of the light-emitting units has a upper surface and a lower surface, and the lower surface is closer to the base than the upper surface and covered by the resist layer, a wavelength conversion layer on the upper surface of each of the light-emitting units, and a trench between any two of the light-emitting units, wherein the trench passes through the wavelength conversion layer to expose the resist layer.

A light-emitting device comprises a base, a resist layer on the base, a plurality of light-emitting units having a side wall on the base, wherein the side wall of the light-emitting unit has a upper surface and a lower surface, and the lower surface is closer to the base than the upper surface, and covered by the resist layer, a wavelength conversion layer on the upper surface of each of the light-emitting units, a glue layer on the wavelength conversion layer, and a trench between any two of the light-emitting units, wherein the trench passes through the glue layer and the wavelength conversion layer to expose the resist layer.

DETAILED DESCRIPTION OF PREFERRED EMBODIMENTS

Figure 1A:
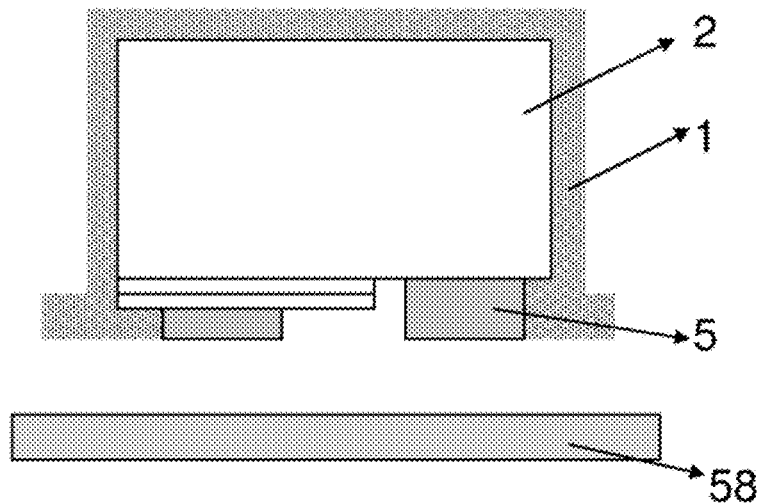
FIGS. 1A and 1B illustrate the conventional bonding process of a light-emitting diode with a phosphor layer.
Figure 1B:
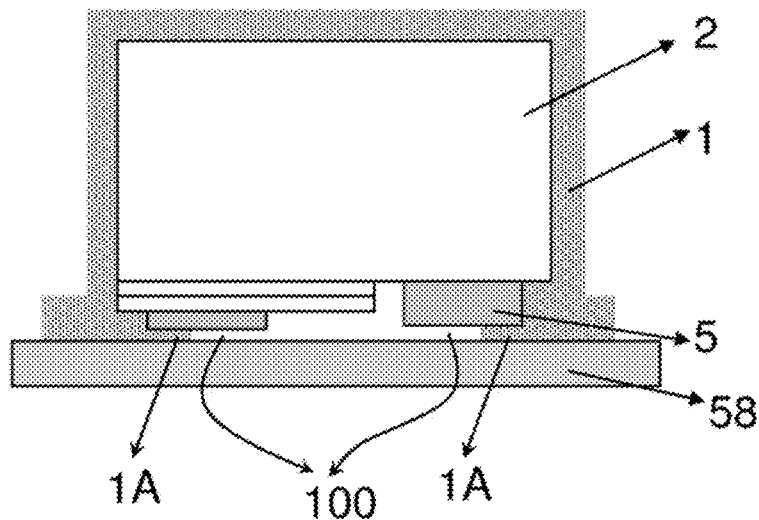

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2A:
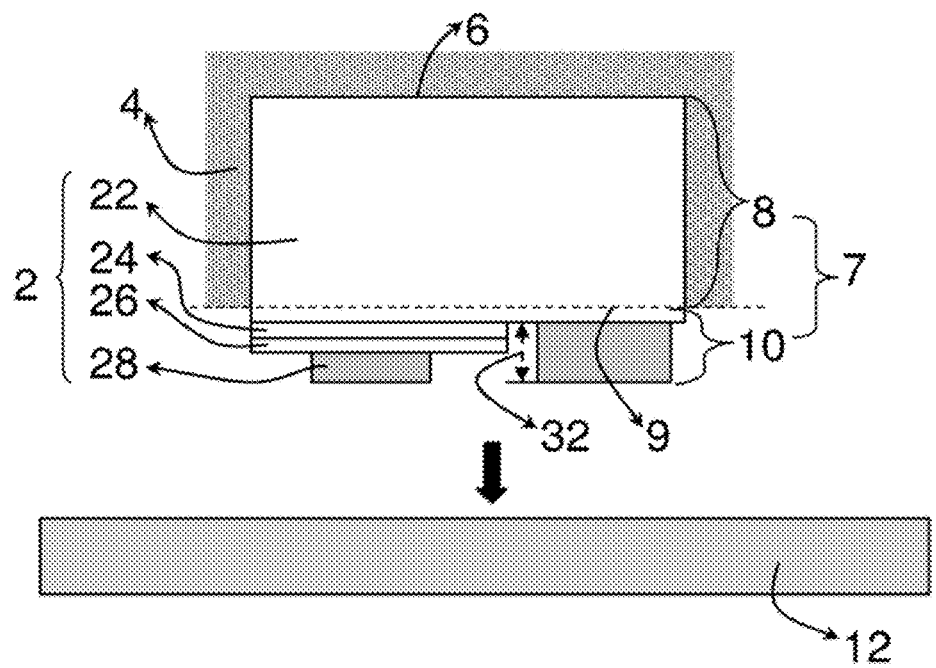
FIGS. 2A and 2B are the cross-sectional view of a light-emitting diode with a wavelength conversion layer according to the first embodiment of the present application.
Figure 2B:
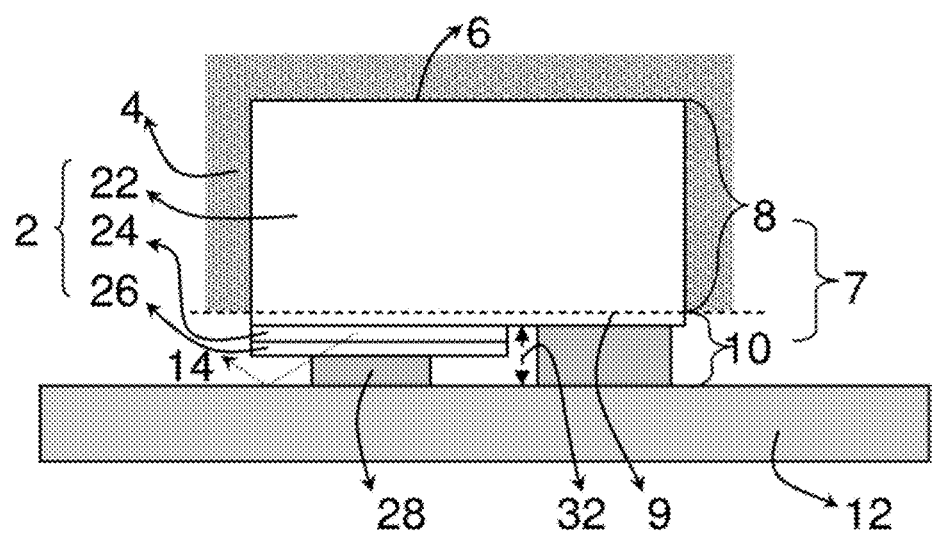

FIGS. 2A and 2B are the cross-sectional view of a light-emitting diode with a wavelength conversion layer according to the first embodiment of the present application.

Referring to the FIG. 2B, the light-emitting diode 2 having semiconductor stacking layers 22, 24, 26 and electrodes 28 is bonded with the base 12. The bonding method can be a high force bonding, such as eutectic bonding, metal bonding, fusion bonding, and a low force bonding, such as adhesive bonding. The base 12 can be a conductive substrate, a support substrate, or a temporary substrate, without limited to a particular substrate. The structure of the electrodes 28 can be a single metal layer or multiple metal layers, and the material of the electrodes comprises Pt, Au, Cu, Sn, Ag, Al, the alloy thereof or the combination thereof. The electrodes are generally formed by evaporation, deposition, electrical plating, or chemical plating. The side wall 7 of the light-emitting diode 2 has an upper surface 8 and a lower surface 10, and the lower surface 10 is closer to the base 12 than the upper surface 8. The wavelength conversion layer 4 covers only the top surface 6 of light-emitting diode 2 and the upper surface 8, and does not cover the lower surface 10. The wavelength conversion layer 4 contains phosphor capable of converting the light of the first wavelength emitted from the light-emitting diode 2 into the light of the second wavelength. In the embodiment, the second wavelength is longer than the first wavelength.

Normally, the structure of the electrodes 28 formed by evaporation is looser than formed by deposition, electrical plating, or chemical plating. Therefore, referring to FIG. 2B, when the light-emitting diode 2 is bonded to the base 12 by high force bonding, the electrodes 28 formed by evaporation shrink and the height 32 of each electrode 28 decreases. Because the lower surface 10 spaces the wavelength conversion layer 4 from base 12 even after the high force bonding, the flow of the wavelength conversion layer 4 into the space between the electrode 28 and the base 12 is prevented.

Figure 3A:
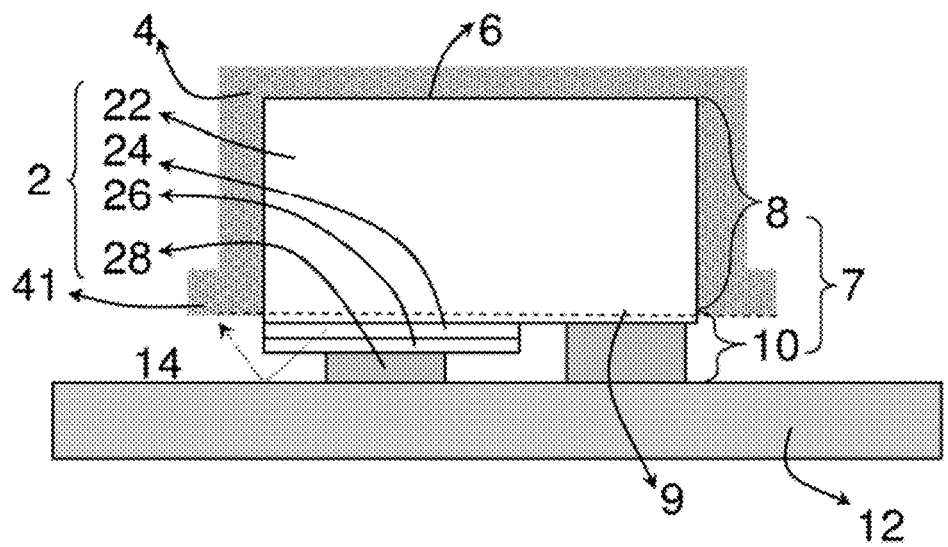
FIG. 3 is the cross-sectional view of a light-emitting diode with a wavelength conversion layer according to the second embodiment of the present application.
Figure 3B:
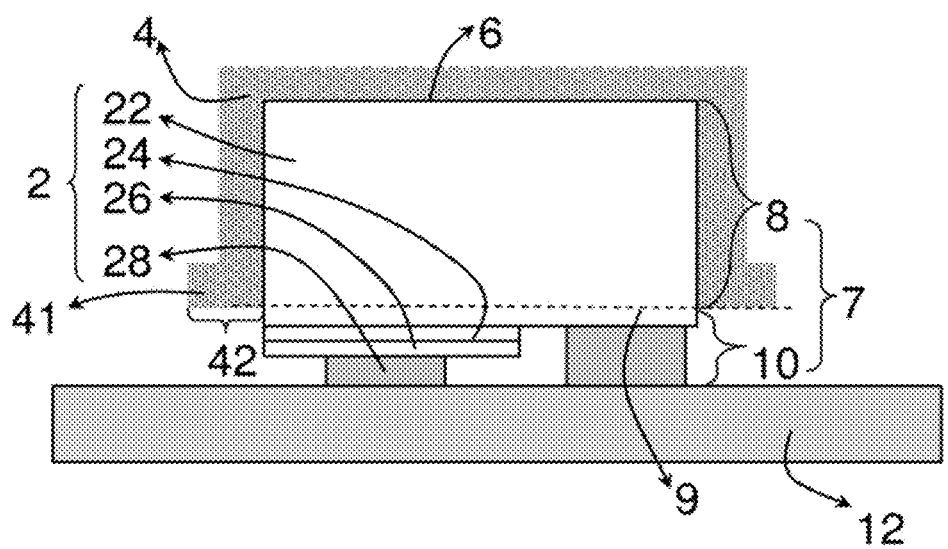

FIG. 3A is the cross-sectional view of a light-emitting diode with a wavelength conversion layer according to the second embodiment of the present application. Referring to FIG. 3A, the difference between the second embodiment and the first embodiment is that the wavelength conversion layer 4 has a protrusion part 41 extending outwards at the ends. Specifically, the protrusion part 41 is formed above the border 9 between the upper surface 8 and the lower surface 10. In the first embodiment, when the light emitted from the active layer 24 passes through the upper surface 8 and the lower surface 10, because the lower surface 10 is not covered by the wavelength conversion layer 4, the light of the first wavelength which passes through the lower surface 10 is not converted into the light of the second wavelength. Thus, with the protrusion part 41, the wavelength converter layer 4 can convert more light of the first wavelength emitted from the active layer 24 which passes through the lower surface 10 than when there is no protrusion part 41. Generally, as indicated in FIG. 3B, the width 42 of the protrusion part is equal to or smaller than 500 μm, and is preferred to be between 10 μm and 300 μm.

Figure 4:
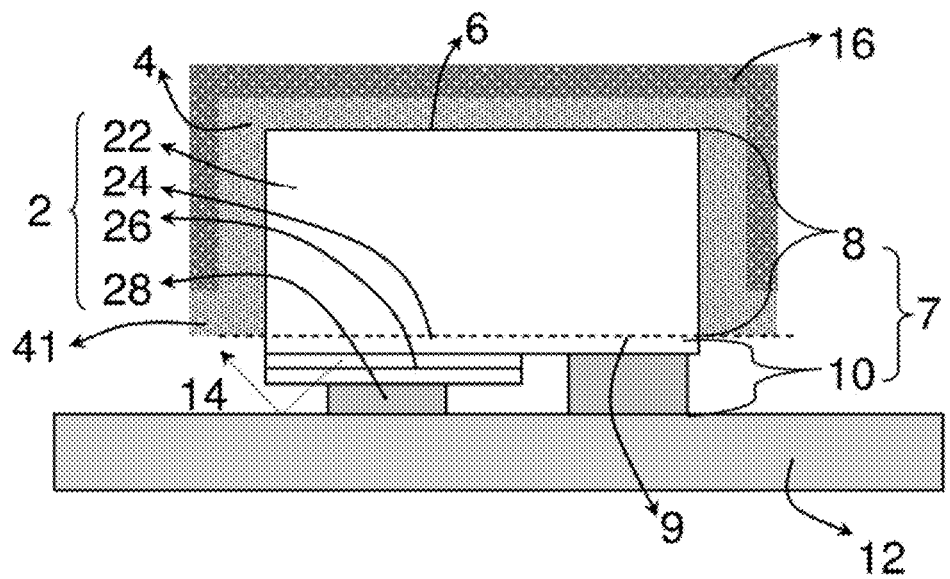
FIG. 4 is the cross-sectional view of a light-emitting diode with a wavelength conversion layer and a glue layer according to the third embodiment of the present application.

FIG. 4 is the cross-sectional view of a light-emitting diode with a wavelength conversion layer and a glue layer according to the third embodiment of the present application. Referring to FIG. 4, the third embodiment is different from the first and second embodiments in that the light-emitting diode has a glue layer 16, which is transparent, covering the wavelength conversion layer 4. The glue layer 16 can reduce the probability of the phosphor particle falling from the wavelength conversion layer 4 so the process stability of forming the wavelength conversion layer 4 is increased. The glue layer 16 can be formed by spin coating, printing, or molding glue filling, and the material of the glue layer 16 can be transparent and elastic material such as epoxy, silicone rubber, silicon resin, silicone gel, elastic PU, porous PU, or acrylic rubber.

Figure 5:
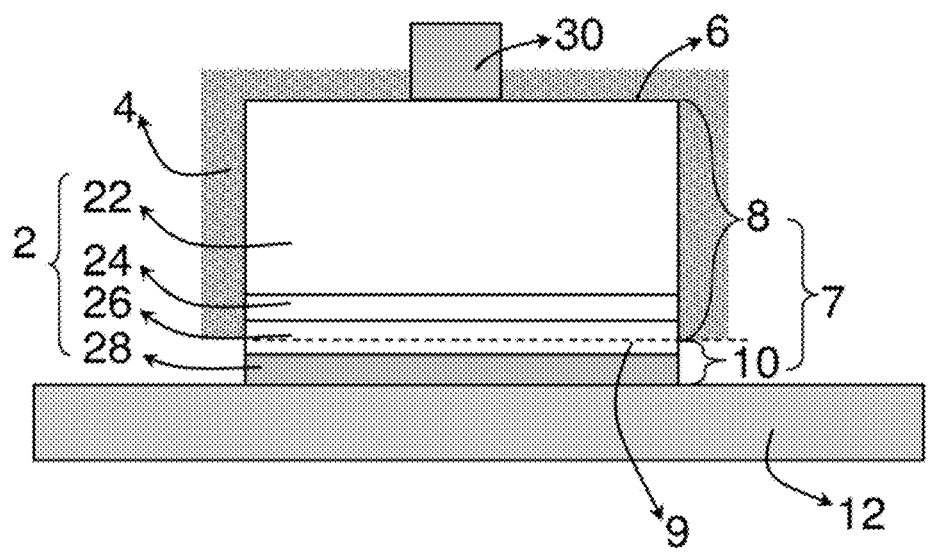
FIG. 5 is the cross-sectional view of a light-emitting device with a wavelength conversion layer according to the fourth embodiment of the present application.

FIG. 5 is the cross-sectional view of a light-emitting device with a wavelength conversion layer according to the fourth embodiment of the present application. The fourth embodiment is different from the first embodiment in that the light-emitting diode 2 has the upper electrode 30 on the top surface 6.

Figure 6:
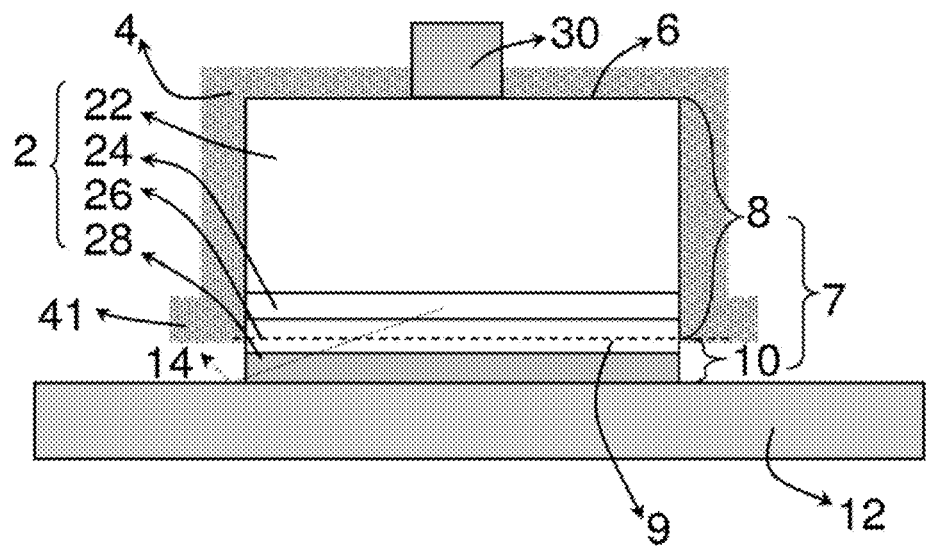
FIG. 6 is the cross-sectional view of a light-emitting device with a wavelength conversion layer according to the fifth embodiment of the present application.

FIG. 6 is the cross-sectional view of a light-emitting device with a wavelength conversion layer which has a protrusion part 41 extending outwards at the ends. Specifically, the protrusion part 41 is formed above the border 9 between the upper surface 8 and the lower surface 10 according to the fifth embodiment of the present application. The fifth embodiment is different from the second embodiment in that the light-emitting diode 2 has the upper electrode 30 on the top surface 6 thereof.

Figure 7:
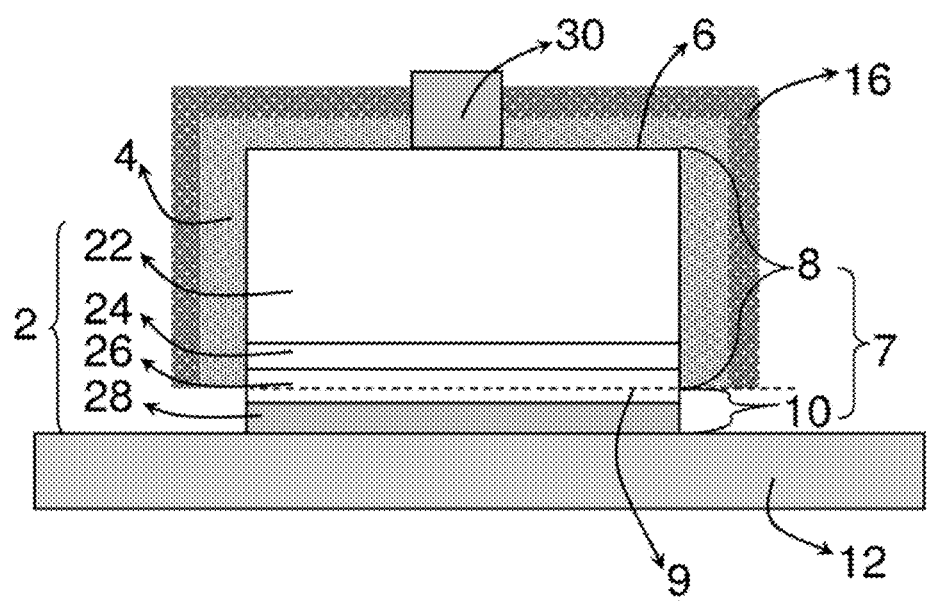
FIG. 7 is the cross-sectional view of light-emitting device with a wavelength conversion layer and a glue layer according to the sixth embodiment of the present application.

FIG. 7 is the cross-sectional view of light-emitting device with a wavelength conversion layer and a glue layer according to the sixth embodiment of the present application. The sixth embodiment is different from the fourth embodiment in that there is a glue layer 16, which is transparent, covering the wavelength conversion layer 4. The glue layer 16 can reduce the probability of the phosphor particle falling from the wavelength conversion layer 4 so the process stability of forming the wavelength conversion layer 4 is increased. The glue layer 16 can be formed by spin coating, printing, or molding glue filling, and the material of the glue layer 16 can be transparent and elastic material such as epoxy, silicone rubber, silicon resin, silicone gel, elastic PU, porous PU, or acrylic rubber.

Figure 8:
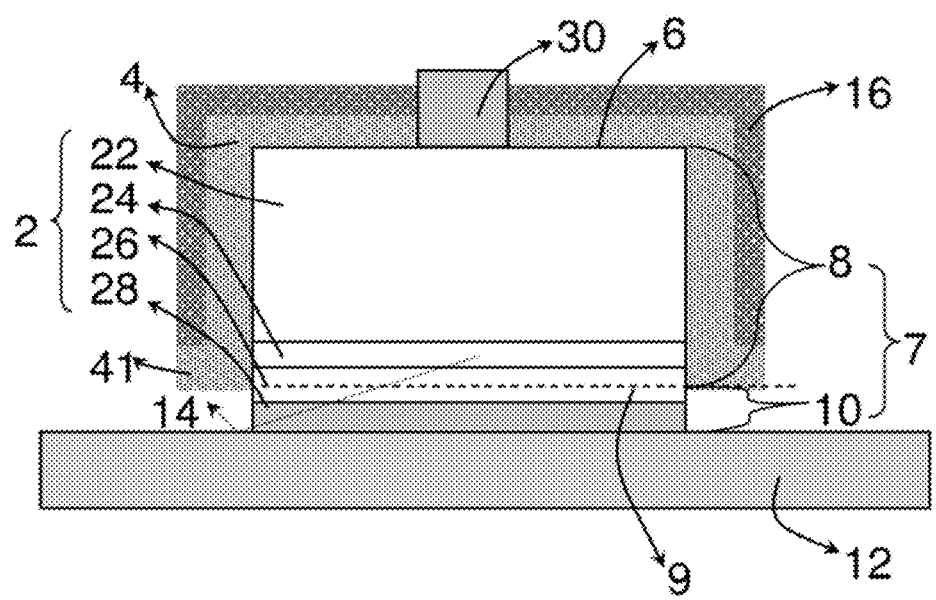
FIG. 8 is the cross-sectional view of light-emitting device with a wavelength conversion layer which has a protrusion part and a glue layer according to the seventh embodiment of the present application.

FIG. 8 is the cross-sectional view of light-emitting device with a wavelength conversion layer which has a protrusion part and a glue layer according to the seventh embodiment of the present application. The seventh embodiment is different from the fifth embodiment in that there is a glue layer 16, which is transparent, covering the wavelength conversion layer 4. The glue layer 16 can prevent the phosphor particle falling from the wavelength conversion layer 4 so the process stability of forming the wavelength conversion layer 4 is increased. The glue layer 16 can be formed by spin coating, printing, or molding glue filling, and the material of the glue layer 16 can be transparent and elastic material such as epoxy, silicone rubber, silicon resin, silicone gel, elastic PU, porous PU, or acrylic rubber.

FIGS. 9A to 9F show the process of manufacturing the light-emitting diode with a wavelength conversion layer which has a protrusion part in accordance with the second embodiment of the present application.

Figure 9A:
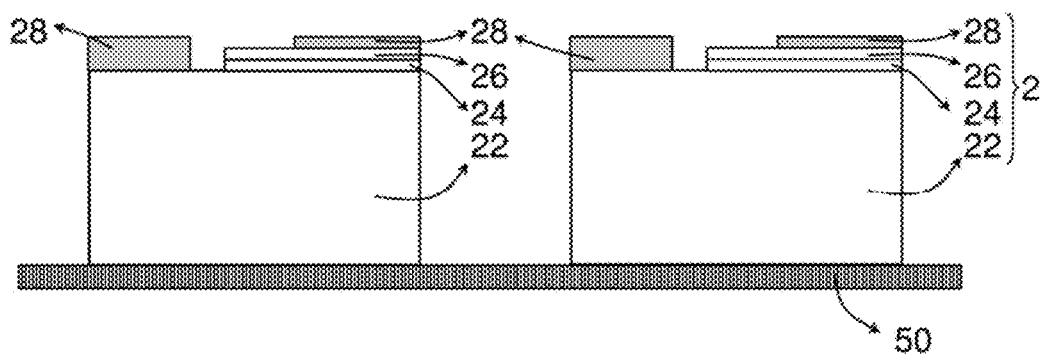
FIGS. 9A to 9F show the process of manufacturing the light-emitting diode with a wavelength conversion layer which has a protrusion part on the edge thereof according to the second embodiment of the present application.
Figure 9B:
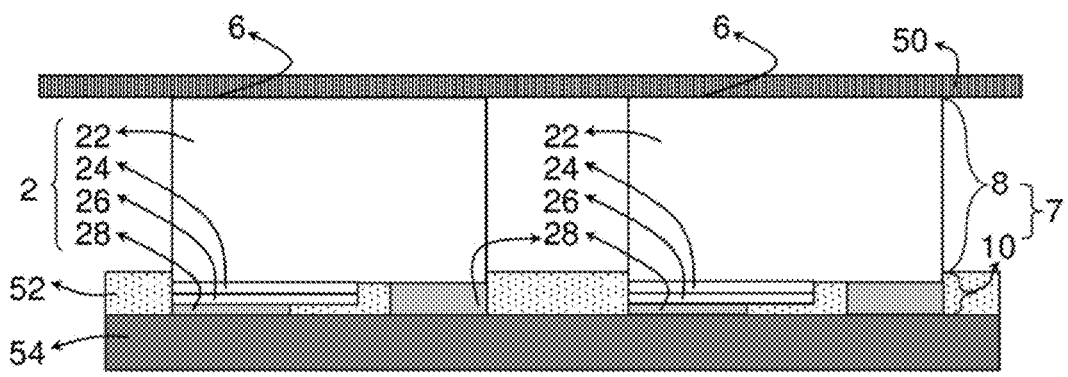
Figure 9C:
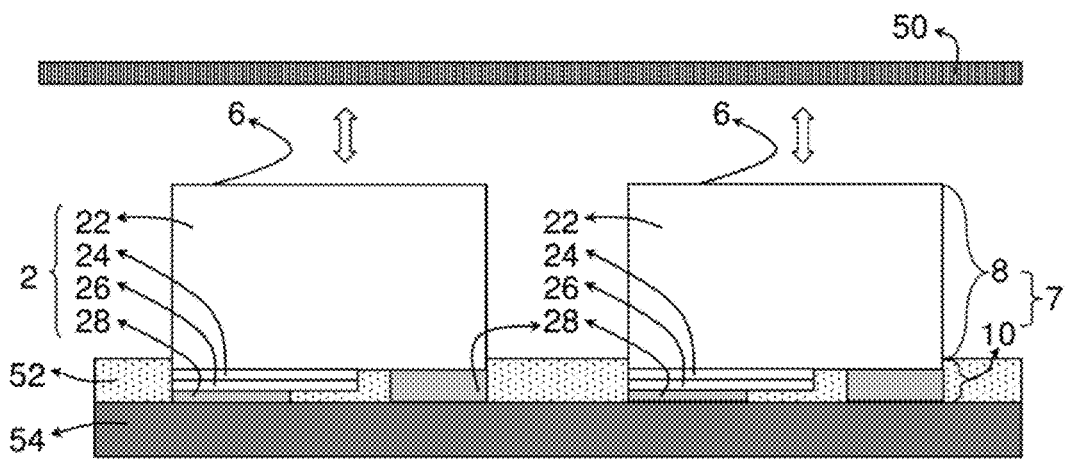
Figure 9D:
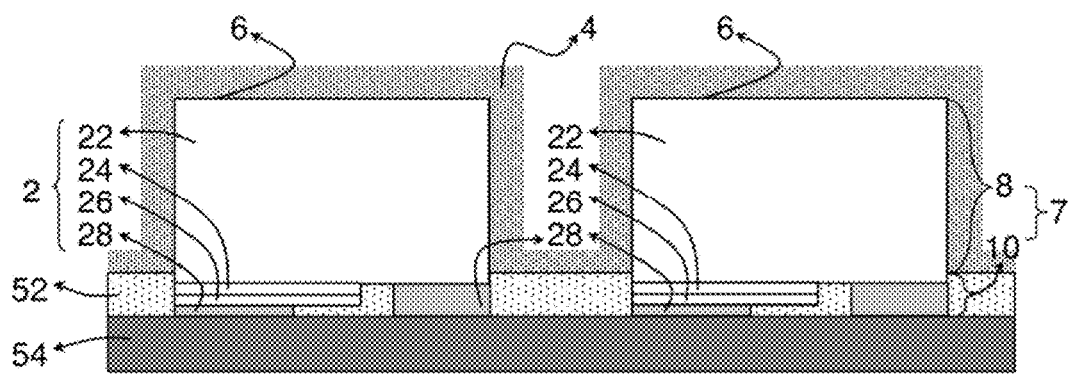
Figure 9E:
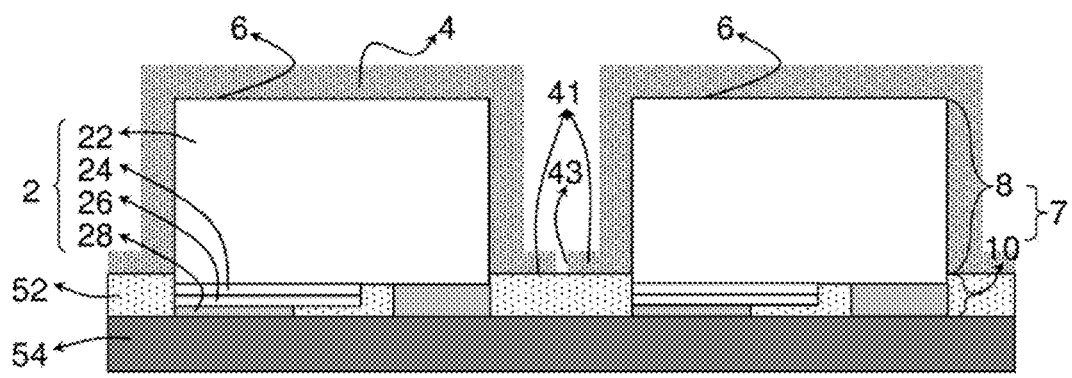
Figure 9F:
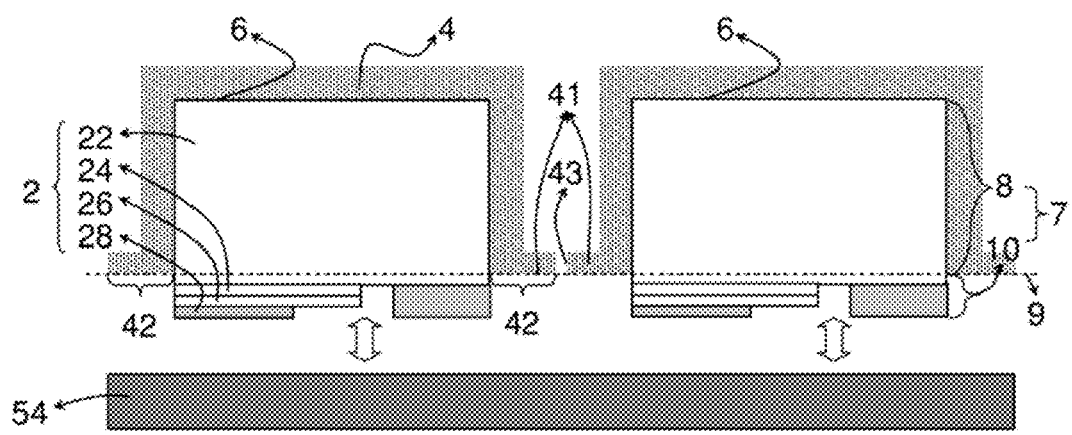

Referring to the FIG. 9A, a plurality of light-emitting diodes 2 is disposed on a tape 50. In FIG. 9B, the plurality of light-emitting diodes 2 is flipped over and disposed on a substrate 54 which is covered by a resist layer 52 which is used to prevent the wavelength conversion layer 4 contacting the substrate 54 in later steps. The resist layer 52 can be removed by light, heating or solvent, and the material of the resist layer 52 can be photo resist or glue. The side wall 7 of each light-emitting diode 2 has an upper surface 8 and a lower surface 10, and the lower surface 10 is closer to the substrate 54. The lower surface 10 of each light-emitting diode 2 is covered by the resist layer 52. In FIG. 9C, the tape 50 is separated from the light-emitting diode 2, and then, in FIG. 9D, a wavelength conversion layer 4 is formed to cover the light-emitting diodes 2 and the resist layer 52. Then, referring to FIG. 9E, a trench 43 is formed between the light-emitting diodes 2 on the wavelength conversion layer 4 to expose the resist layer 52. The trench 43 can be formed by the method such as photolithography, etching, or ICP cutting. The trench 43 can define the width of protrusion part 42. As indicated in FIG. 9F, the width 42 of the protrusion part is equal to or smaller than 500 μm, and is preferred to be between 10 μm and 300 μm. Finally, referring to FIG. 9F, the resist layer 52 is removed and the substrate 54 is separated from the plurality of light-emitting diodes 2.

Figure 10A:
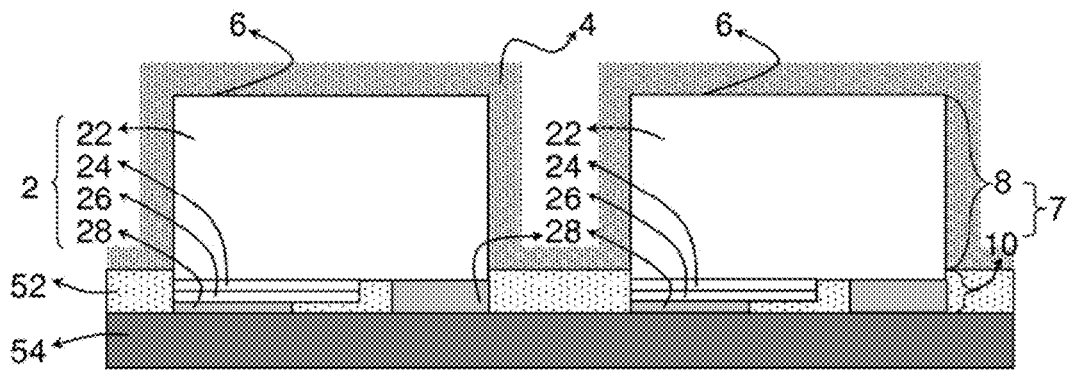
FIGS. 10A to 10D show the process of manufacturing the light-emitting diode with a wavelength conversion layer and a glue layer according to the third embodiment of the present application.
Figure 10B:
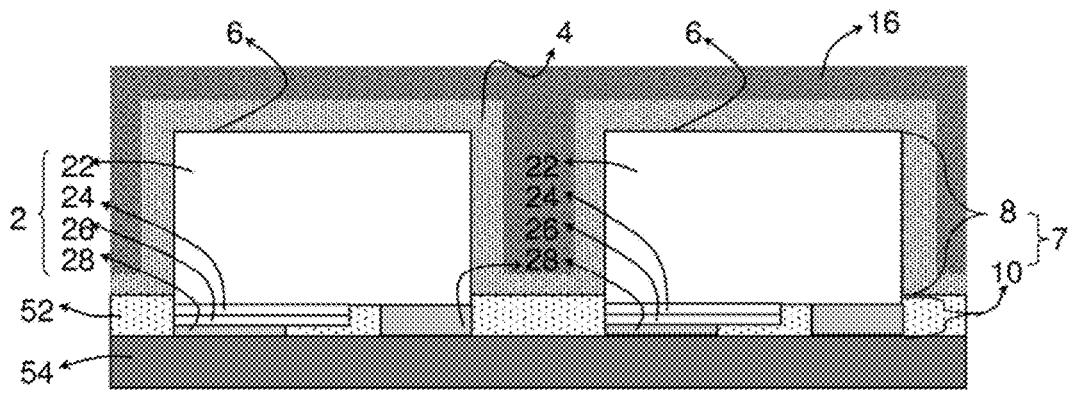
Figure 10C:
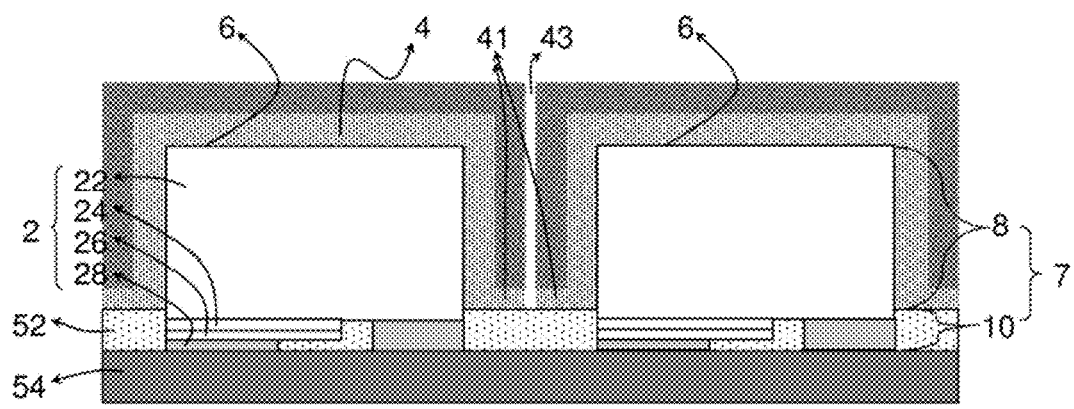
Figure 10D:
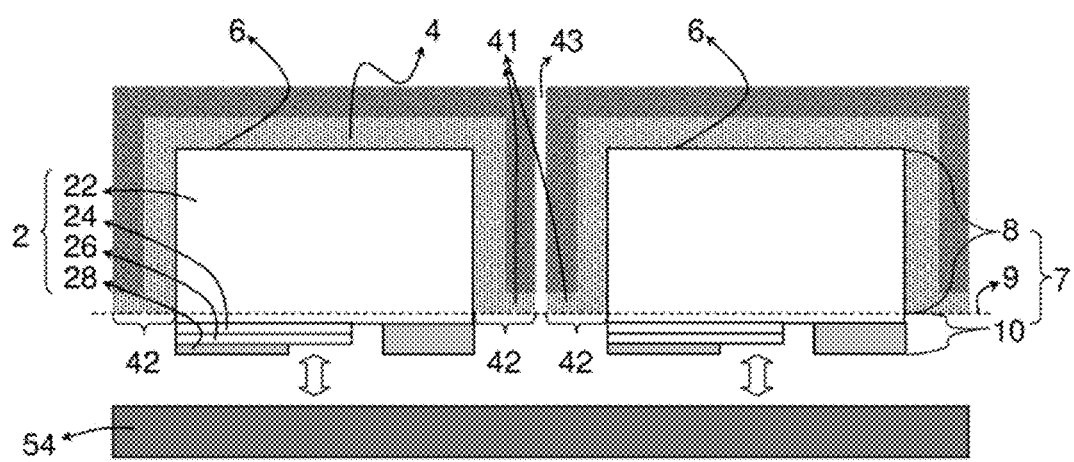

FIGS. 10A to 10D show the process of manufacturing the light-emitting diode with a wavelength conversion layer and a glue layer for the third embodiment of the present application. Referring to the FIG. 10A, the plurality of light-emitting diode 2 is disposed on the substrate 54. There is a resist layer 52 formed on the substrate 54 and covering the lower surface 10 of each light-emitting diode 2. The resist layer 52 can be removed by light, heating or solvent, and the material of the resist layer 52 can be photo resist or glue. A wavelength conversion layer 4 is formed to cover the plurality of light-emitting diodes 2 and the resist layer 52. The resist layer 52 is used to prevent the wavelength conversion layer 4 contacting the substrate 54. Referring to FIG. 10B, a glue layer 16, which is transparent, is formed to cover the wavelength conversion layer 4. The glue layer 16 can be formed by spin coating, printing, or molding glue filling, and the material of the glue layer 16 can be transparent and elastic material such as epoxy, silicone rubber, silicon resin, silicone gel, elastic PU, porous PU, or acrylic rubber. Then, referring to FIG. 10C, a trench 43 is formed between the light-emitting diodes 2 extending from the glue layer 16 and through the wavelength conversion layer 4 to expose the resist layer 52. The trench 43 can be formed by the method such as photolithography, etching, or ICP cutting and define the width of protrusion part 42. As indicated in FIG. 10D, the width 42 of the protrusion part is equal to or smaller than 500 μm, and is preferred to be between 10 μm and 300 μm. Finally, referring to FIG. 10D, the resist layer 52 is removed and the substrate 54 is separated from the plurality of light-emitting diodes 2.

Figure 11A:
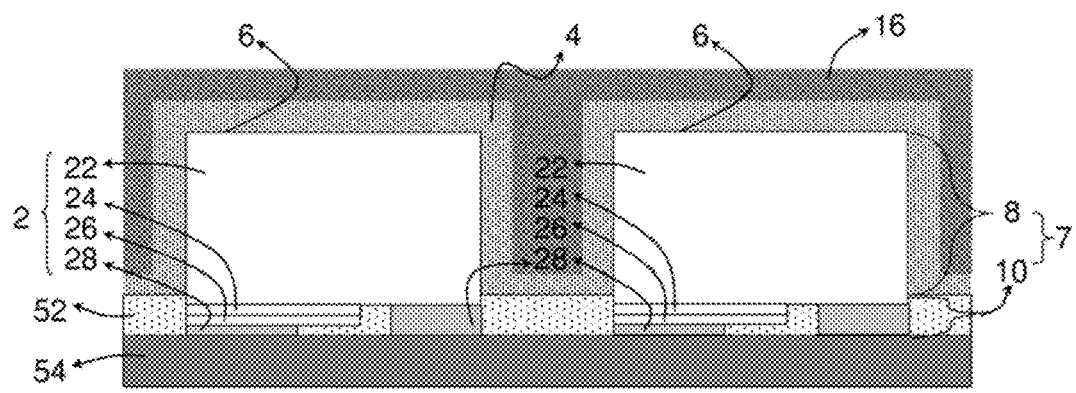
FIGS. 11A to 11E show another process of manufacturing the light-emitting diode with a wavelength conversion layer and a glue layer according to the third embodiment of the present application.
Figure 11B:
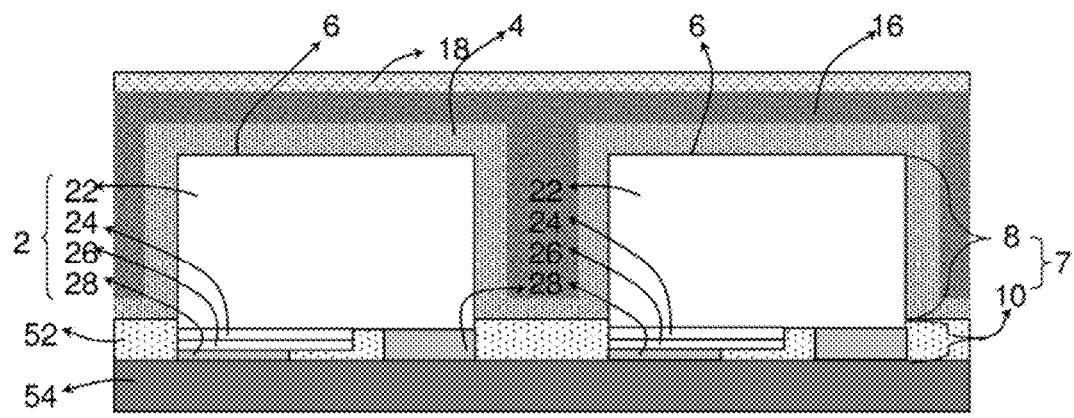
Figure 11C:
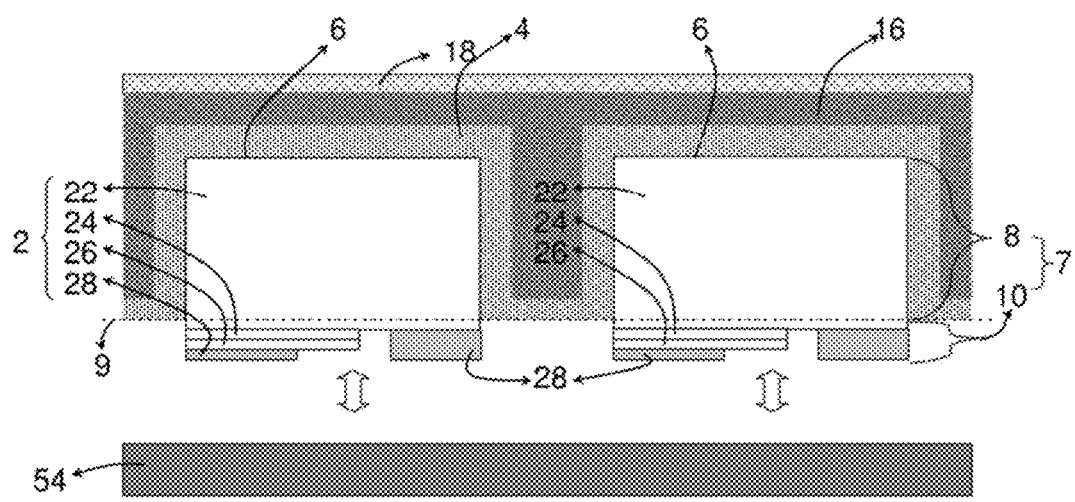
Figure 11D:
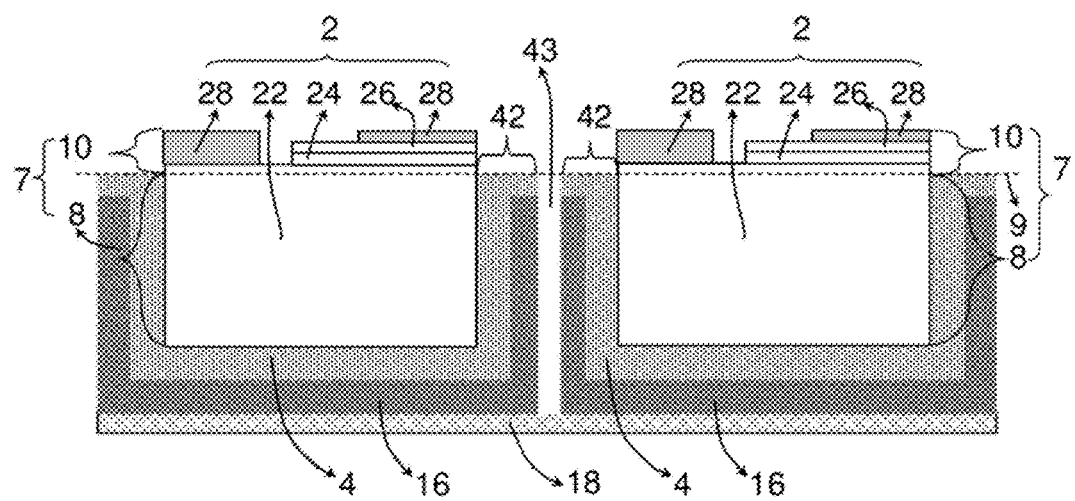
Figure 11E:
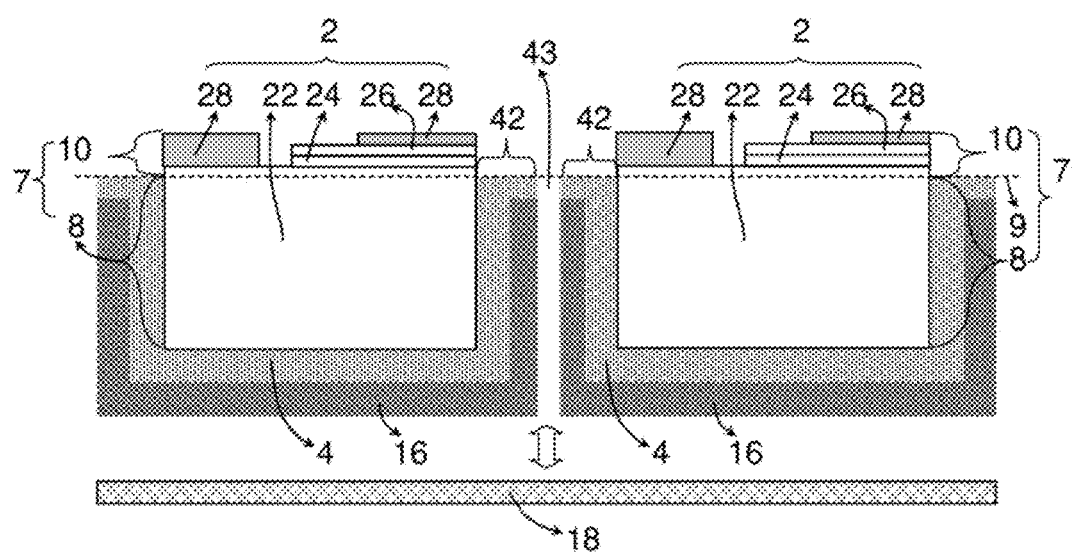

FIGS. 11A to 11E show another process of manufacturing the light-emitting diode with a wavelength conversion layer and a glue layer for the third embodiment of the present application. Referring to the FIG. 11A, the plurality of light-emitting diode 2 is disposed on the substrate 54. There is a resist layer 52 formed on the substrate 54 and covering the lower surface 10 of each light-emitting diode. The resist layer 52 can be removed by light, heating or solvent, and the material of the resist layer 52 can be photo resist or glue. A wavelength conversion layer 4 is formed to cover the plurality of light-emitting diodes 2 and the resist layer 52. The resist layer 52 is used to prevent the wavelength conversion layer 4 contacting the substrate 54. A glue layer 16, which is transparent, is formed to cover the wavelength conversion layer 4. The glue layer 16 can be formed by spin coating, printing, or molding glue filling, and the material of the glue layer 16 can be transparent and elastic material such as epoxy, silicone rubber, silicon resin, silicone gel, elastic PU, porous PU, or acrylic rubber. Then, referring to FIG. 11B and FIG. 11C, a tape 18 is disposed on the glue layer 16 and the resist layer 52 and the substrate 54 are removed. Referring to FIG. 11D, the plurality of light-emitting diodes 2 is flipped upside down and a trench 43 is formed between the plurality of light-emitting diodes 2 extending from the wavelength conversion layer 4 and through the glue layer 16 to expose the tape 18. The trench 43 can be formed by the method such as photolithography, etching, or ICP cutting and define the width of protrusion part 42. As indicated in FIG. 11D, the width 42 of the protrusion part is equal to or smaller than 500 μm, and is preferred to be between 10 μm and 300 μm. Finally, referring to FIG. 11E, the tape 18 is separated from the plurality of light-emitting diodes 2.

Figure 12:
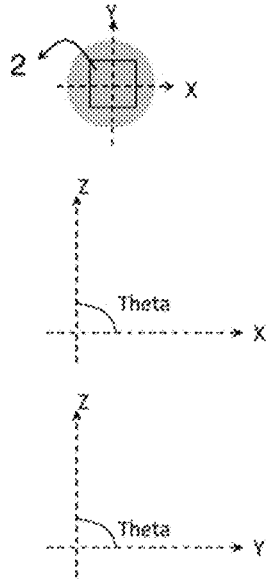
FIG. 12 shows the color temperature distribution of the light emitted from the light-emitting diode according to one embodiment of the present application.
Figure 12:
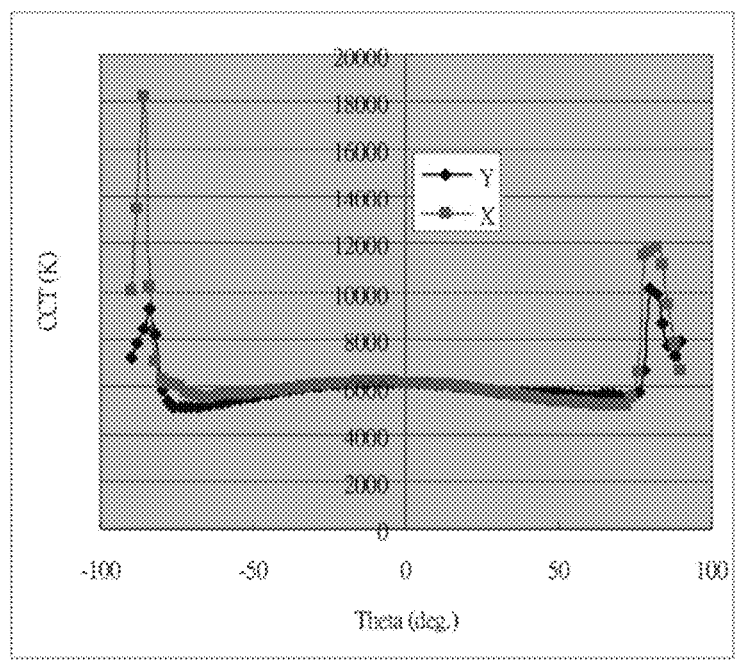

FIG. 12 show the color temperature distribution of the light emitted from the light-emitting diode 2 covered by the wavelength conversion layer with the protrusion part. The view angle of the XY plane is the top view of the light-emitting diode 2. As indicated in FIG. 12, when the view angle (Theta) is near 90° or –90°, or more precisely, when the view angle (Theta) is between –90° and –75° or between 75° and 90°, the color temperature (CCT) can be over 6000K. In other words, the light generated from light emitting diode 2 can be bluish when the view angle (Theta) is near 90° or –90°.

What is claimed is:

1. A light-emitting device comprising:
  a light-emitting unit comprising a semiconductor stack;
  a wavelength conversion layer overlaying the light-emitting unit and covering the light-emitting unit, wherein the wavelength conversion layer comprises phosphor material;
  a glue layer conformably overlaying the wavelength conversion layer and covering the wavelength conversion layer, wherein the wavelength conversion layer comprises a protrusion part uncovered by the glue layer and extending outwards at an end of the wavelength conversion layer, and the end of the wavelength conversion layer is in physical contact with a sidewall of the light-emitting unit; and
  a base adjacent to the sidewall of the light-emitting unit, wherein the side wall has an upper surface and a lower surface, and the wavelength conversion layer and the glue layer both cover the upper surface of the sidewall and is not in physical contact to the lower surface of the sidewall, wherein a region directly below the protrusion part and between the protrusion part and the base is vacant.

2. The light-emitting device according to claim 1, wherein a bluish light is emitted from the light-emitting unit when the view angle of the top view of the light-emitting device is near 90° or –90°.

3. The light-emitting device according to claim 1, wherein the height of the lower surface is greater than or equal to 5 nm.

4. The light-emitting device according to claim 1, further comprising a border between the upper surface and the lower surface, wherein the protrusion part is located above the border.

5. The light-emitting device according to claim 1, wherein the width of the protrusion part is equal to or smaller than 500 μm.

6. The light-emitting device according to claim 1, further comprising a conductive unit disposed under the light-emitting unit uncovered by the wavelength conversion layer and the glue layer.

7. The light-emitting device according to claim 1, wherein the wavelength conversion layer converts a portion of a light having a first wavelength emitted from the light-emitting unit into a light having a second wavelength.

8. The light-emitting device according to claim 1, wherein the base comprises an electrically conductive substrate or a temporary substrate.

9. The light-emitting device according to claim 8, wherein the light-emitting unit is electrically connected with the base.

10. The light-emitting device according to claim 1, wherein the light-emitting unit comprises a top surface connected to the sidewall, and the wavelength conversion layer conformably covers the top surface.

11. The light-emitting device according to claim 10, wherein the light-emitting unit comprises a conductive unit on the top surface, wherein the conductive unit is uncovered by the wavelength conversion layer and the glue layer.

12. The light-emitting device according to claim 1, wherein the phosphor material comprises phosphor particles and the glue layer comprises transparent and elastic material for reducing the probability of the phosphor particles falling from the wavelength conversion layer.

13. The light-emitting device according to claim 1, wherein a width of the protrusion part is equal to a total width of the glue layer and the wavelength conversion layer except the protrusion part, wherein the width of the protrusion part is measured from a direction perpendicular to the side wall.

14. The light-emitting device according to claim 1, wherein the light-emitting unit is apart from the glue layer.

15. The light-emitting device according to claim 1, wherein the wavelength conversion layer is interposed between the light-emitting unit and the glue layer.

16. The light-emitting device according to claim 1, wherein the wavelength conversion layer directly connects with the light-emitting unit.

\* \* \* \* \*